United States Patent
Komoto et al.

(10) Patent No.: US 7,391,102 B2
(45) Date of Patent: Jun. 24, 2008

(54) SEMICONDUCTOR APPARATUS CONFIGURED WITH A LEAD FRAME HAVING SUFFICIENT STRENGHT TO PROTECT AGAINST EXTERNAL FORCES

(75) Inventors: Satoshi Komoto, Tokyo (JP); Hajime Okuda, Yokohama (JP); Hirokazu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 10/961,409

(22) Filed: Oct. 12, 2004

(65) Prior Publication Data

US 2005/0082646 A1   Apr. 21, 2005

(30) Foreign Application Priority Data

Oct. 15, 2003   (JP)   .......................... P2003-355245

(51) Int. Cl.
  *H01L 23/495*   (2006.01)
  *H01L 23/02*   (2006.01)
  *H01L 23/52*   (2006.01)
  *H01L 23/06*   (2006.01)
  *H01L 23/34*   (2006.01)
  *H01L 23/28*   (2006.01)
  *H01L 23/29*   (2006.01)
(52) U.S. Cl. .................. 257/676; 257/680; 257/787; 257/788; 257/684; 257/692; 257/723; 257/E23.039
(58) Field of Classification Search ................ 257/668, 257/787, 788, 790, 676, 680, 684, 692, 723, 257/E23.039
See application file for complete search history.

(56) References Cited

U.S. PATENT DOCUMENTS 5,485,479 A    1/1996  Kitamura et al.
5,825,794 A   10/1998  Ogino et al.
6,020,632 A *  2/2000  Barone et al. ............... 257/704
6,181,720 B1   1/2001  Kanemoto et al.
6,274,890 B1 * 8/2001  Oshio et al. .................... 257/98
6,447,328 B1 * 9/2002  Feldman ..................... 439/482

(Continued)

FOREIGN PATENT DOCUMENTS

JP    10-303508 A    11/1998

(Continued)

OTHER PUBLICATIONS

JP Office Action dtd Sep. 11, 2007, JP Appln. 2003-355245 w/English Summary.

*Primary Examiner*—Luan Thai
(74) *Attorney, Agent, or Firm*—Banner & Witcoff, Ltd.

(57) ABSTRACT

Disclosed is a semiconductor apparatus including: a first molded resin portion; a plate-shaped lead frame closely attached to the first molded resin portion; a second molded resin portion attached facing the first molded resin portion and the lead frame; and one or more elements attached on the lead frame on a side which faces the second molded resin portion, the one or more elements including a semiconductor element, wherein any part of at least one of the elements does not exist in a region composed of an aggregation of line segments, each line segment being formed by any two points on an outer periphery of the plate-shaped lead frame outside the first and second molded resin portions and all of the line segments being contained inside a board of the lead frame.

20 Claims, 9 Drawing Sheets

U.S. PATENT DOCUMENTS

| | | | |
|---|---|---|---|
| 6,885,076 B2 * | 4/2005 | Honda et al. | 257/433 |
| 6,902,416 B2 * | 6/2005 | Feldman | 439/219 |
| 2002/0123223 A1 * | 9/2002 | Van Rijckevorsel et al. | 438/686 |
| 2003/0016710 A1 | 1/2003 | Komoto | |
| 2004/0175080 A1 * | 9/2004 | Yamauchi et al. | 385/93 |

FOREIGN PATENT DOCUMENTS

| JP | 2003-031885 | 1/2003 |
|---|---|---|

* cited by examiner

SEMICONDUCTOR APPARATUS CONFIGURED WITH A LEAD FRAME HAVING SUFFICIENT STRENGHT TO PROTECT AGAINST EXTERNAL FORCES

CROSS REFERENCE TO RELATED APPLICATIONS

This application is based upon and claims the benefit of priority from the prior Japanese Patent Application No. 2003-355245, filed on Oct. 15, 2003; the entire contents of which are incorporated herein by reference.

BACKGROUND

1. Field of the Invention

The present invention relates to a semiconductor apparatus including a semiconductor element, more particularly, to a semiconductor apparatus suitable for ensuring mechanical strength against external force.

2. Description of the Related Art

A semiconductor laser apparatus includes a semiconductor laser chip and is composed of a lead frame which functions as a mounting surface for the semiconductor laser chip and as a terminal, a molded resin portion to enclose and integrate the semiconductor laser chip and the lead frame, and so on. Such a structure is disclosed, for example, Japanese Patent Laid-open Application No. 2003-31885.

When the semiconductor laser apparatus is mounted or is already mounted on various kinds of substrates and equipment, considerable external force is sometimes applied thereto. For example, when the semiconductor laser apparatus is used for reading from and writing to an optical disk device, there exists a process for pressing the semiconductor laser-apparatus into a pick-up head case, in which considerable external force is applied. In this case, mechanical robustness is required for the semiconductor laser apparatus.

In particular, the lead frame is usually plate-shaped and vulnerable to external force such as bending and twisting. As described above, the lead frame is a mounting surface for a semiconductor element such as a semiconductor laser chip and a substrate on which the semiconductor element is placed, and it is fixed for mounting, for example, by an adhesive. However, if the lead frame is transformed by external force, large stress is applied to an adhesive layer and the mounted element.

SUMMARY

A semiconductor apparatus according to an aspect of the present invention includes: a first molded resin portion; a plate-shaped lead frame closely attached to the first molded resin portion; a second molded resin portion attached facing the first molded resin portion and the lead frame; and one or more elements attached on the lead frame on a side which faces the second molded resin portion, the one or more elements including a semiconductor element, wherein any part of at least one of the elements does not exist in a region composed of an aggregation of line segments, the line segment being formed by any two points on an outer periphery of the plate-shaped lead frame outside the first and second molded resin portions and all of the line segment being contained inside a board of the lead frame.

A semiconductor apparatus according to another aspect of the present invention includes: a first molded resin portion; a plate-shaped lead frame closely attached to the first molded resin portion; a second molded resin portion attached facing the first molded resin portion and the lead frame; and one or more semiconductor elements attached on the lead frame on a side which faces the second molded resin portion, the one or more elements including a semiconductor element, wherein any part of at least one of the elements does not exist in a region of the lead frame composed of an aggregation of line segments, the line segment being formed by any two points on a plan-view outer periphery of the first and second molded resin portions contained in a plan-view region of the lead frame, all of the line segment being contained inside a board of the lead frame.

A semiconductor apparatus according to still another aspect of the present invention includes: a first molded resin portion; a plate-shaped lead frame closely attached to the first molded resin portion; a second molded resin portion attached facing the first molded resin portion and the lead frame; and an element including a laser chip and a light-receiving element, the element and the light-receiving element being attached on the lead frame on a side which faces the second molded resin portion, wherein any part of the light-receiving element does not exist in a region composed of an aggregation of line segments, the line segment being formed by any two points on an outer periphery of the plate-shaped lead frame outside the first and second molded resin portions and all of the line segment being contained inside a board of the lead frame.

DETAILED DESCRIPTION

An embodiment of the present invention will be described with reference to the drawings. These drawings are provided only for the illustrative purpose and in no respect, are intended to limit the present invention.

In a semiconductor apparatus according to aspects of the present invention, attention is paid to the fact that external force is applied to a portion of a lead frame outside molded resin portions, and it is assumed that any two points on such an outer periphery of the lead frame are points where force (that is, twisting force mainly) is applied. It can be thought that if all of the line segments between the two points are contained on the lead frame, transformation may be transmitted to an interior portion of the lead frame. Hence, any element should not be mounted in a region composed of an aggregation of such line segments. This prevents occurrence of stress in the element and its bonding surface, which makes it possible to ensure sufficient mechanical strength.

As a form of the embodiment, the lead frame can have a concave figure as a plate-shape. The concave figure makes it easier to secure the aforementioned mounting region for the element.

As another form of the embodiment, any part of the element which does not exist in the region of the lead frame may be apart from the second molded resin portion. This makes it possible to include a light-receiving element for monitoring as the element and use a space between the semiconductor element and the second molded resin as a transmission space of laser light.

As still another form of the embodiment, any part of the element which does not exist in the region of the lead frame can be a light-receiving element. In this case, it can be used as an element for monitoring laser light emitted from a semiconductor laser chip.

As yet another form of the embodiment, a surface of the lead frame to which the element, any part of which does not exist in the region of the lead frame, is attached can constitute the same plane as a surface of the lead frame to which another element is attached. This simplifies the shape of the lead frame in a thickness direction. Moreover, the lead frame in a position where the element is attached does not sink into the first molded resin portion, which is advantageous in terms of resistance to heating at the time of the attachment.

As still yet another form of the embodiment, the lead frame may be composed of two or more portions apart from each other as a plate-shape figure. The lead frame is not limited to being composed of one portion.

As another form of the embodiment, part of the lead frame may be embedded in the first molded resin portion. For example, a terminal portion may be embedded therein.

Figure 1:
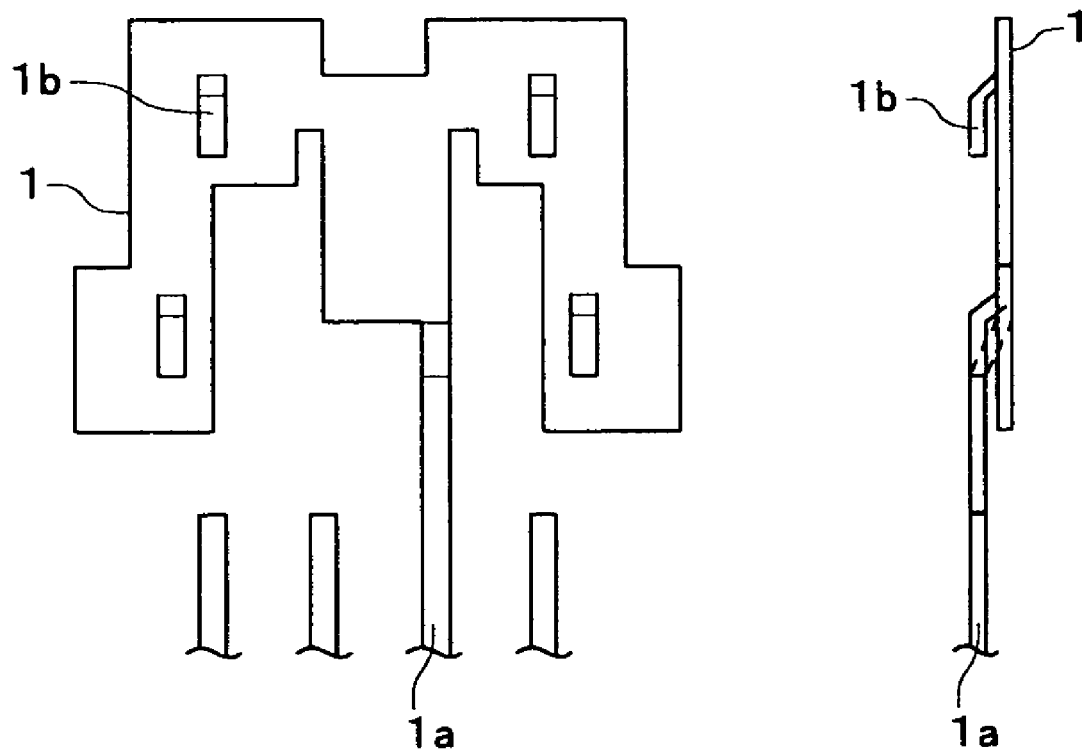
FIG. 1 provides schematic front and side views showing a semiconductor apparatus according to an embodiment of the present invention in order of manufacturing steps.
Figure 2:
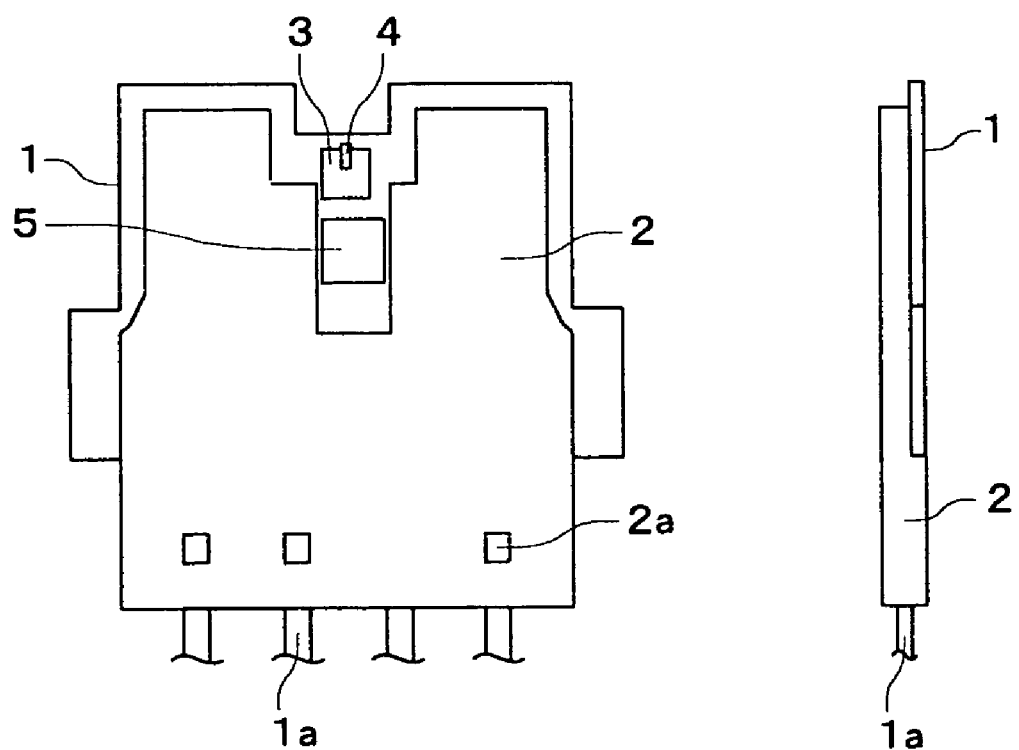
FIG. 2 provides schematic front and side views subsequent to FIG. 1, showing the semiconductor apparatus according to the embodiment of the present invention in order of manufacturing steps.
Figure 3:
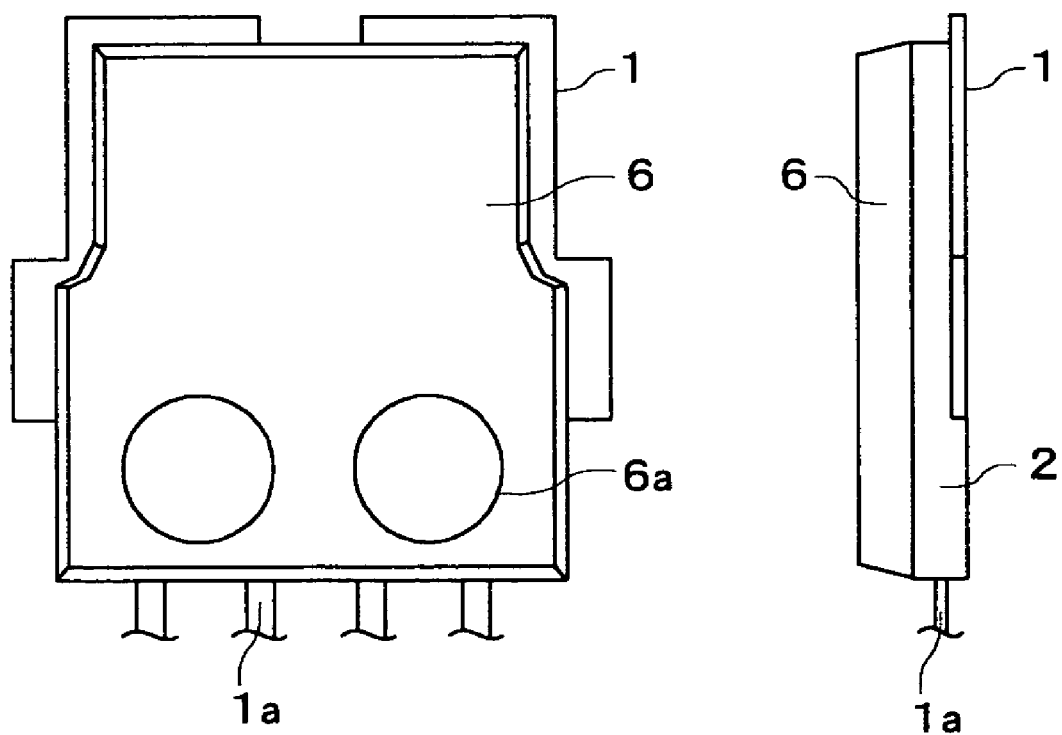
FIG. 3 provides schematic front and side views subsequent to FIG. 2, showing the semiconductor apparatus according to the embodiment of the present invention in order of manufacturing steps.

Based on the above, the embodiment of the present invention will be described below with reference to the drawings. FIG. 1 to FIG. 3 provide a schematic front and side views showing a semiconductor apparatus (a semiconductor laser apparatus) according to the embodiment of the present invention in order of manufacturing steps. In these figures, the same reference numerals will be used to designate the same or similar portions. First, a lead frame 1 having a shape such as shown in FIG. 1 is prepared. This shape can be obtained by pressing and forming a plate member which becomes a material. Although described later, the shape of the lead frame 1 shown in FIG. 1 is selected so that elements mounted thereon (on board) become more difficult to separate from the lead frame 1. Incidentally, reference numeral 1a denotes a lead terminal portion, and reference numeral 1b denotes a nail-shaped portion to increase engagement with a lower molded resin (which will be described later).

Incidentally, a copper-based material is often used as a base material for the lead frame 1 in consideration of heat release performance during operation. Depending on the circumstances, it is also possible to use an iron-based material such as 42 alloy. It is desirable to previously sheathe the lead frame 1 properly, for example, plate it with gold, nickel, palladium, or the like in consideration of assembly performance.

Then, as shown in FIG. 2, a lower molded resin 2 of an envelope is formed on the lead frame 1 by injection molding or the like. The molded resin 2 is formed so as to enclose a portion where elements are placed and leave an electrical connection portion 2a to the lead terminal portion 1a as shown in the figure. Thereafter, in this embodiment, a ceramic substrate 3 and a light-receiving element 5 are placed and fixed on the lead frame 1. They are fixed by a method in which an adhesive such as gold-tin solder is used and thermally melted to approximately 300° C. This provides electrical continuity. According to the circumstances, a silver epoxy adhesive or the like can be used in place of the aforementioned solder, which is, however, disadvantageous in terms of squeeze-out of the adhesive and contamination caused by gas exhaust.

A material such as aluminum nitride having a linear expansion coefficient close to that of a laser chip 4 placed and fixed on the ceramic substrate 3 and having a higher thermal conductivity than silicon and the like is suitable for the ceramic substrate 3. Moreover, an electrode is previously formed on the surface of the ceramic substrate 3 by gold deposition and patterning. After the ceramic substrate 3 is placed and fixed on the lead frame 1, the laser chip 4 is placed and fixed on the ceramic substrate 3. The aforementioned gold-tin solder and silver epoxy adhesive are also applicable to a method for fixing the laser chip 4 on the ceramic substrate 3.

Various kinds of laser elements can be used as the laser chip 4. For example, a monolithic dual wavelength semiconductor laser element which emits both infrared light and visible light and a single wavelength semiconductor laser element which emits only infrared light or only visible light (red or blue-violet) can be used. Moreover, plural semiconductor laser elements may be placed and fixed on the ceramic substrate 3.

Incidentally, as shown, a rear surface of the lead frame 1 in a position where the ceramic substrate 3 and the light-receiving element 5 are fixed is exposed in connection with the molded resin 2. This is because consideration is given to heat release performance with respect to heating required when the ceramic substrate 3 and the light-receiving element 5 are fixed as described above and heat release performance when the laser chip 4 and the light-receiving element 5 are used. On the other hand, the lead terminal portion 1a of the Lead frame 1 is embedded in and enclosed by the molded resin 2.

A surface of the lead frame 1 on which the light-receiving element 5 is placed and a surface thereof on which the laser chip 4 is placed are on the same plane. In contrast, it is also possible to incline the surface on which the light-receiving element 5 is placed so as to be able to receive laser light for monitoring from the laser chip 4 more easily. However, in general, this poses an extremely large limitation to product design and device design when a string of lead frames 1 are moved, for example, in a hoop line, which results in harmful effects such as a deterioration in product characteristics, an increase in equipment cost, and a reduction in assembly speed. Also in this case, the portion of the lead frame 1 on which the light-receiving element 5 is placed sinks into the molded resin 2, which causes a disadvantage that high-temperature heating at the time of fixing described above becomes difficult.

As a supplementary explanation of the molded resin 2, this molded resin 2 is molded so as to be closely attached to the lead frame 1 as described above. Elements such as the light-receiving element 5 are thermally bonded on the lead frame 1 with which the molded resin 2 is integrated. Therefore, a material such as a heat-resistant engineering resin such as PPA (polyphthalamide), liquid crystal polymer, or the like is suitable for the molded resin 2. In addition to the above, materials such as PSF (polysulfone), PES (polyethersulfone), PPS (polyphenylene sulfide), PEEk (polyetheretherketone), PAR (polyarylate), PAI (polyamideimide), PEI (polyetherimide), PI (polyimide), FR (PTFR: polytetrafluoroethylene) can be used. If heat resistance, chemical resistance, mechanical strength, lead adhesion, moldability, exhaust gas, cost, and so on are considered comprehensively, PPA is thought to be the most suitable. Moreover, in terms of heat resistance, a thermosetting resin such as epoxy is also available in addition to the aforementioned thermoplastic resins, but the thermosetting resin is disadvantageous in terms of the occurrence of fins after transfer molding, characteristic change at high temperature, and the like.

After the aforementioned formation of the molded resin 2, and placement and fixing of the ceramic substrate 3, the light-receiving element 5, and the laser chip 4 are completed, respective electrodes (not shown) and the connection portion 2a of the lead terminal portion 1a are connected by bonding wires (not shown). Thus, the assembly of an interior portion of the laser apparatus is completed.

Next, as shown in FIG. 3, a molded resin 6 previously molded as an upper envelope is accurately superimposed and fixed on the lower molded resin 2. In this embodiment, after the molded resin 6 is fixed, a space is left between the molded resin 6, and the laser chip 4 and the light-receiving element 5. There are various kinds of fixing methods, and, for example, an adhesive, thermal welding, ultrasonic bonding, press fitting/caulking, and the like can be used. In the use of an adhesive, for example, after a silicon-based adhesive is applied to a bonding surface of the molded resin 2, the upper molded resin 6 is attached to the molded resin 2 and then cured and bonded at approximately 200° C.

Alternatively, in the case of fixing by thermal caulking, the molded resin 6 can be fixed to the molded resin 2 side, for example, by providing one of more projections on the molded resin 2 side, providing holes corresponding to these projections on the molded resin 6 side on the lid side, fitting these projections into the holes, and then crushing the projections by pressing the molded resin 6 toward the projections while applying heat. If the projections and the holes are formed here with a desired accuracy, the molded resin 6 can be accurately attached to the molded resin 2. When the molded resin 2 is PPA, for example, sufficient fixing strength can be obtained by crushing along with heating to approximately 150° C. to 300° C. If the aforementioned thermal caulking is adopted, caulking tracks 6a remain on the surface of the molded resin 6 on the lid side.

Incidentally, as the molded resin 6 on the lid side, a material having a relatively low heat resistance temperature or a metal-based material, for example, other than resin can be selected. If no adhesive material is used in this case, it is possible to simplify the process and save the material cost, and anxiety exerting on a bad influence on characteristics such as adhesion of impurities to the laser chip 4 and optical systems is reduced.

Moreover, a light reflecting surface can be provided at part of an inner surface of the molded resin 6 which constitutes one side of the envelope. In so doing, there arises an effect that by reflecting the laser light for monitoring by using an interior space as a transmission space of the laser light, the laser light emitted from behind the laser chip 4 is guided to the light-receiving element 5 apart from the lid side molded resin 6 to increase the amount of incident light. For this purpose, it is desirable to select a material for the molded resin 6 and surface treatment thereof so that light reflectivity increases. For example, the same PPA as used for the molded resin 2 of the lower envelope can be used as a material for the upper molded resin 6. Moreover, PBT, metal, or plated molded resin 6 can also be used. When plural laser chips 4 and light-receiving elements 5 are continuously mounted on the lead frame 1, the laser light can be separated for the respective light-receiving elements 5 by performing lead cutting on the inner surface.

Figure 4:
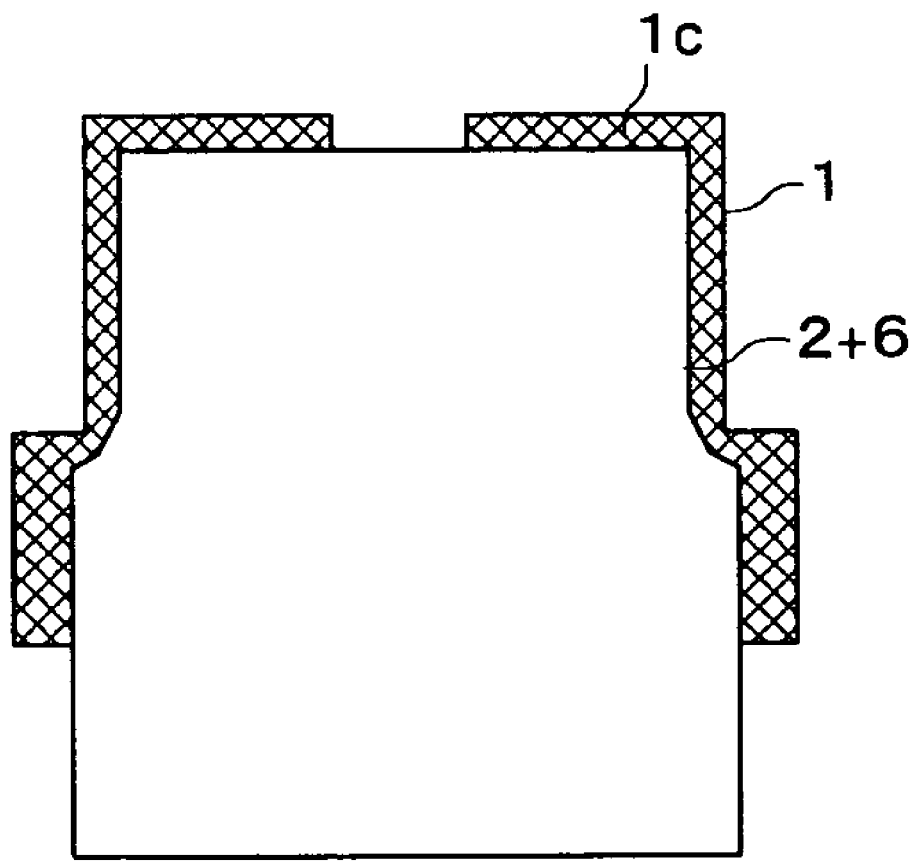
FIG. 4 is a diagram specially abstracting and showing a positional relationship between an envelope composed of two molded resins and a lead frame which are shown in FIG. 3.

The semiconductor apparatus according to the embodiment of the present invention has been described above in order of manufacturing steps. Methods for preventing the application of external force in the semiconductor apparatus assembled as described above will be further described with reference to FIG. 4 to FIG. 6. In these figures, the same reference numerals are used to designate the same portions as those explained above. First, FIG. 4 is a diagram specially abstracting and showing a positional relationship between the envelope composed of the molded resin 2 and the molded resin 6 and the lead frame 1. Incidentally, as concerns the lead frame 1, an illustration of the lead terminal portion is omitted.

As shown in FIG. 4, the lead frame 1 includes a portion outside the molded resins 2 and 6. This portion 1c outside the molded resins 2 and 6 is shown by a crosshatch pattern. It should be understood that no element is placed on the portion 1c outside the molded resins 2 and 6. The existence of the portion 1c is common, and this portion 1c is used as a position standard when the semiconductor laser apparatus is incorporated into various kinds of equipment and used as a fixing portion for the incorporation. For example, when the semiconductor laser apparatus is used for reading from and writing to an optical disk device, this semiconductor laser apparatus is pressed into a pick-up head case and mounted in a predetermined position by using the portion 1c.

Accordingly, external force is obviously applied to the portion 1c outside the molded resins 2 and 6. Hence, it is assumed that any two points on an outer periphery of the portion 1c outside the molded resins 2 and 6 are points where force is applied (namely, twisting force is mainly taken up). Under this assumption, it can be thought that if all of the line segments between the two points are contained on the lead frame 1, transformation may be transmitted to the interior portion of the lead frame 1 (the interior portion hidden by the molded resins 2 and 6). Hence, any semiconductor element whose separation from the lead frame 1 becomes a problem is not mounted in a region composed of an aggregation of such line segments. This prevents occurrence of stress in the semiconductor element and its bonding surface and ensures sufficient mechanical strength.

Figure 5:
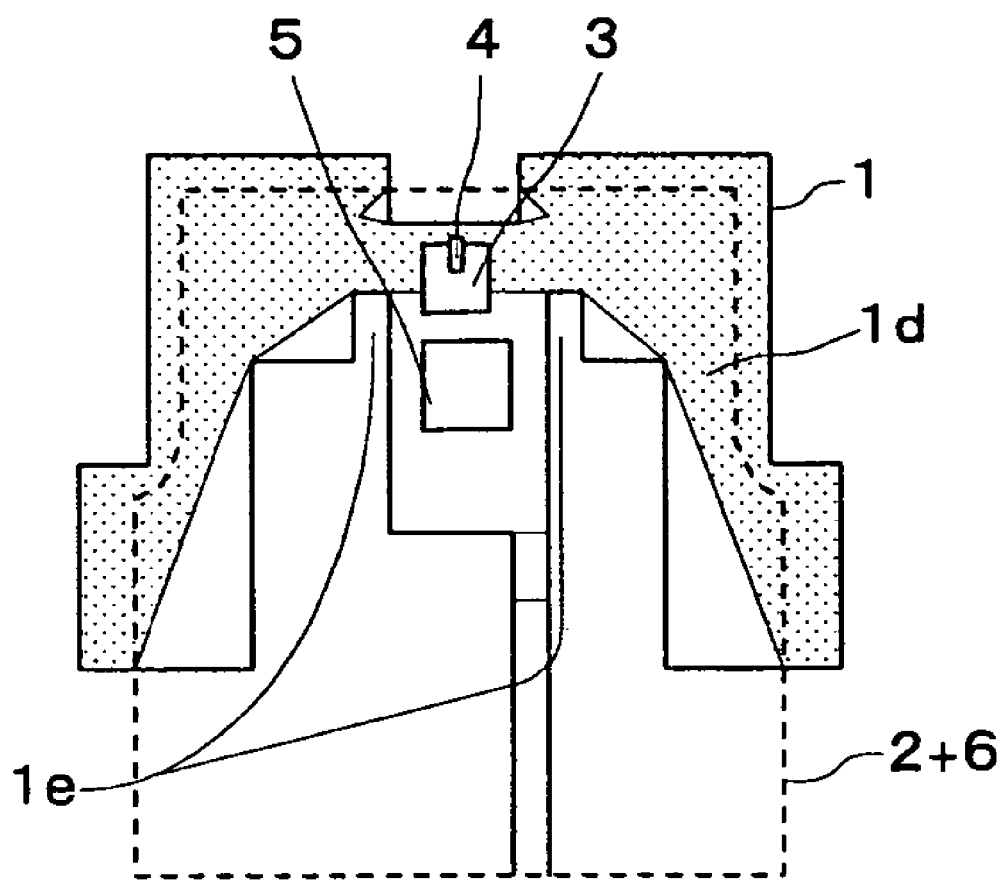
FIG. 5 is a diagram showing a relationship between a region on the lead frame composed of an aggregation of line segments, the line segment being formed by any two points on an outer periphery of a portion of the lead frame outside the molded resins shown in FIG. 4 and all of the line segment being contained inside a board of the lead frame, and a position where a light-receiving element is placed and fixed (when cuts are provided).

This is specifically shown in FIG. 5 in the embodiment described above. FIG. 5 is a diagram showing a relationship between a region 1d on the lead frame 1 composed of an aggregation of line segments, each line segment being formed by any two points on the outer periphery of the portion 1c outside the molded resins 2 and 6 and all of the line segments being contained inside a board of the lead frame 1, and a position where the light-receiving element 5 is placed and fixed. The region 1d is shown by a dot pattern.

Figure 6:
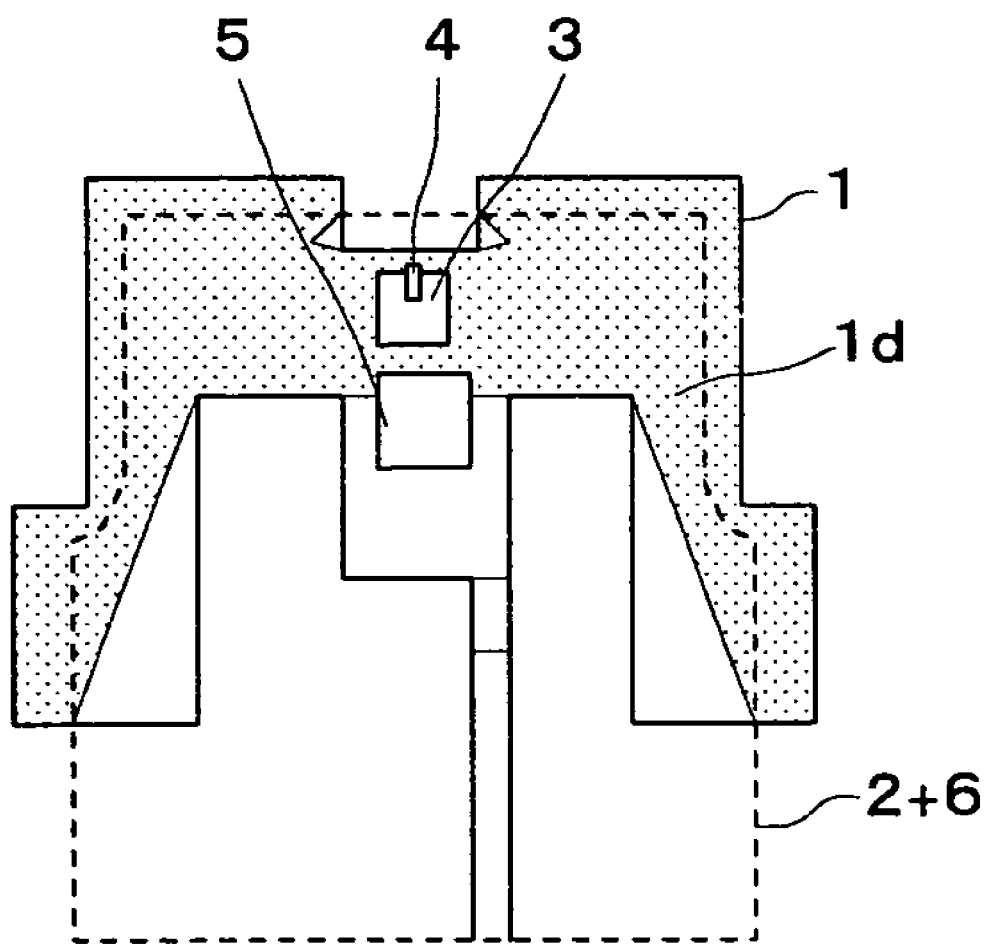
FIG. 6 is a diagram showing a relationship between the region on the lead frame composed of an aggregation of line segments, the line segment being formed by any two points on the outer periphery of the portion of the lead frame outside the molded resins shown in FIG. 4 and all of the line segments being contained inside the board of the lead frame, and the position where the light-receiving element is placed and fixed (when no cut is provided).

As shown in FIG. 5, the light-receiving element 5 is placed and fixed without any part thereof overlapping with the region 1d. Therefore, the transformation of the lead frame 1 by external force does not reach a placement position of the light-receiving element 5 (to be exact, the amount of transformation is extremely small in the placement position), which can effectively prevent such a disadvantage that the light-receiving element 5 is separated (detached) from the lead frame 1. More specifically, it can be said that this effect is attributed to slit-shaped cuts 1e provided on both sides of the placement position of the light-receiving element 5 on the lead frame 1. This becomes clear when compared to a case in FIG. 6. FIG. 6 shows a case where no slit-shaped cut 1e is provided on either side of the placement position of the light-receiving element 5 on the lead frame 1, which is the similar diagram as FIG. 5. In FIG. 6, the cut 1e is not provided, whereby the light-receiving element 5 is placed and fixed with part thereof overlapping with the region 1d.

In the above description, the light-receiving element 5 is not placed in "the region 1d on the lead frame 1 composed of an aggregation of line segments, each line segment being formed by any two points on the outer periphery of the portion 1c outside the molded resins 2 and 6 and all of the line segments being contained inside a board of the lead frame 1", but as an assumption, no element is provided in the portion 1c outside the molded resins 2 and 6 of the lead frame 1, and hence the description enclosed in the above quotation marks is substantially the same as "a region on the lead frame 1 composed of an aggregation of line segments, each line segment being formed by any two points on a plan-view outer periphery of the molded resins 2 and 6 contained in a plan-view region of the lead frame 1 and all of the line segments being contained inside the board of the lead frame 1"

From the above description, examples of a shape taken by the lead frame 1 are shown more generally in FIG. 7A to FIG. 7I and FIG. 8A to FIG. 8F. FIG. 7A to FIG. 7I and FIG. 8A to FIG. 8G are schematic plan views showing respective examples of the shape of the lead frame 1 in the embodiment of the present invention (Note that an illustration of the lead terminal portion is omitted, and only essential portions are extracted and simplified). In FIG. 7A to FIG. 7I and FIG. 8A to FIG. 8F, reference numerals 10a to 10o denote a lead frame, and reference numeral 50 denotes a semiconductor element (for example, light-receiving element) whose separation becomes a problem. In FIG. 7A to FIG. 7I and FIG. 8A to FIG. 8F, the region 1d defined above is shown by a dot pattern as in FIG. 5 and FIG. 6, and a position corresponding to the molded resins 2 and 6 is shown by a broken line. In any case, any part of the semiconductor element 50 whose separation becomes a problem does not overlap with the region shown by the dot pattern.

Figure 7A:
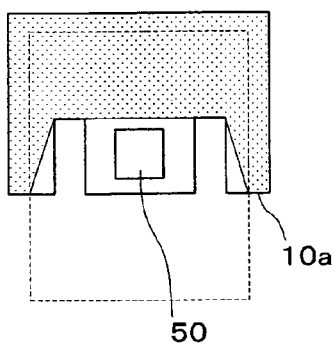
FIG. 7A to FIG. 7I are schematic plan views respectively showing examples of the shape of the lead frame in the embodiment of the present invention.
Figure 7B:
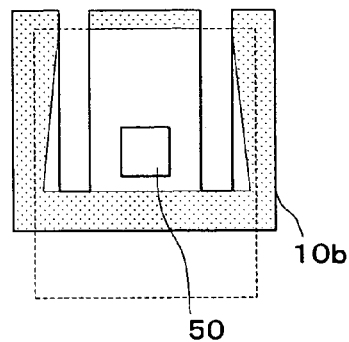
Figure 7C:
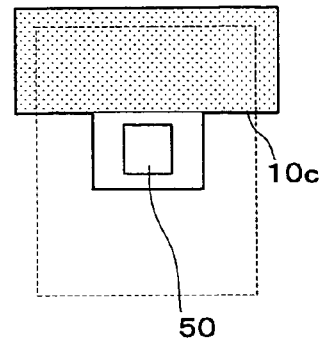
Figure 7D:
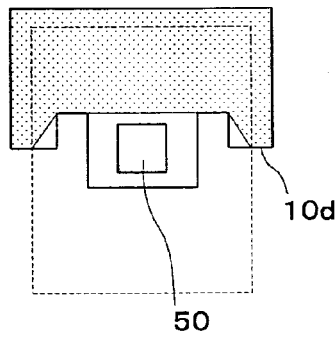
Figure 7E:
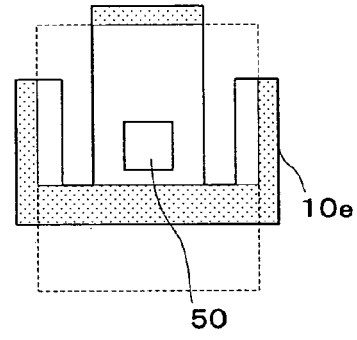
Figure 7F:
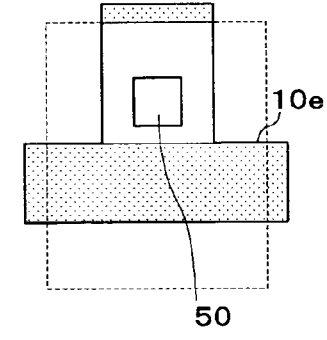
Figure 7G:
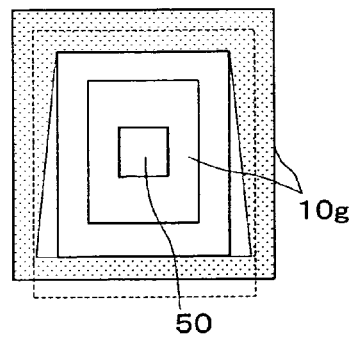
Figure 7H:
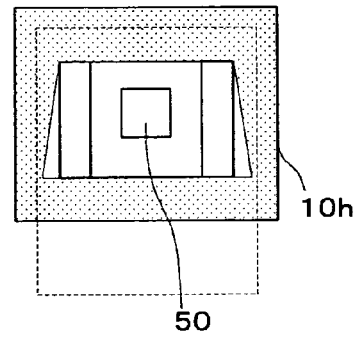
Figure 7I:
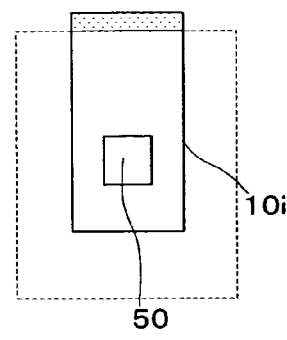
Figure 8A:
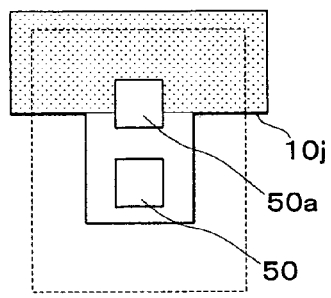
FIG. 8A to FIG. 8F are schematic plan views subsequent to FIG. 7A to FIG. 7I, respectively showing examples of the shape of the lead frame in the embodiment of the present invention.
Figure 8B:
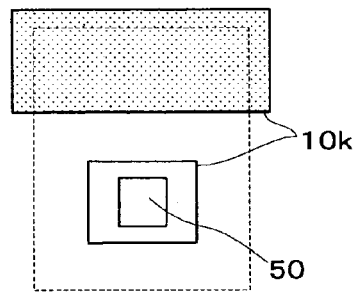
Figure 8C:
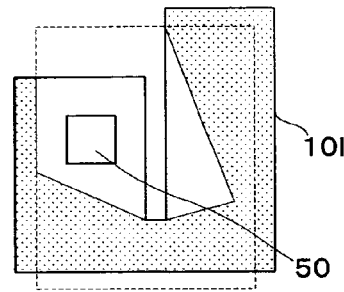
Figure 8D:
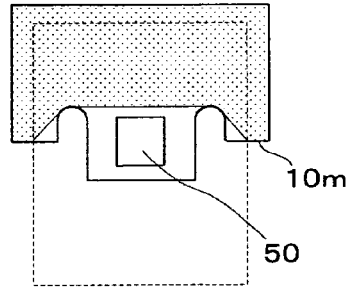
Figure 8E:
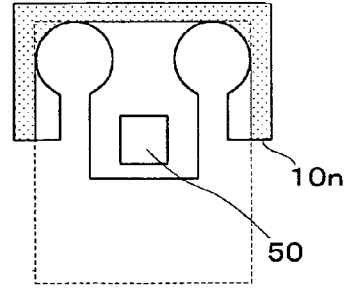
Figure 8F:
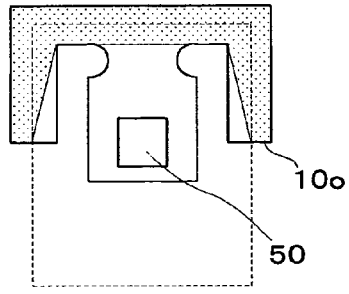

Out of the lead frames 10a to 10o shown in FIG. 7A to FIG. 7I and FIG. 8A to FIG. 8F, those shown in FIG. 7A, FIG. 7B, FIG. 7C, FIG. 7D, FIG. 7E, FIG. 7F, FIG. 8A, FIG. 8C, FIG. 8D, FIG. 8E, and FIG. 8F are common in that they have a concave figure as a figure. The concave figure means a figure in which when line segments connecting any two points on an outer periphery of the figure are assumed, part of any of the line segments lies outside an interior portion of the figure (Note that when there is a hole (FIG. 7H), the hole is not regarded as an exterior portion of the figure). When the formation of the slit-shaped cut (See the reference numeral 1e in FIG. 5) is considered, the concave figure becomes a strong candidate for the shape of the lead frame 1. Moreover, the shape of the lead frame 1 need not be continuous as a single shape. Examples thereof are shown in FIG. 7F and FIG. 8B.

Incidentally, a semiconductor element and a substrate whose separation from the lead frame 1 does not become a problem, for example, because a different bonding method is adopted, a different material is used, or the like may be placed and fixed in the aforementioned region 1d where the amount of transformation is large. For example, a semiconductor element or a substrate shown by reference numeral 50a in FIG. 8A corresponds to the above.

Figure 9A:
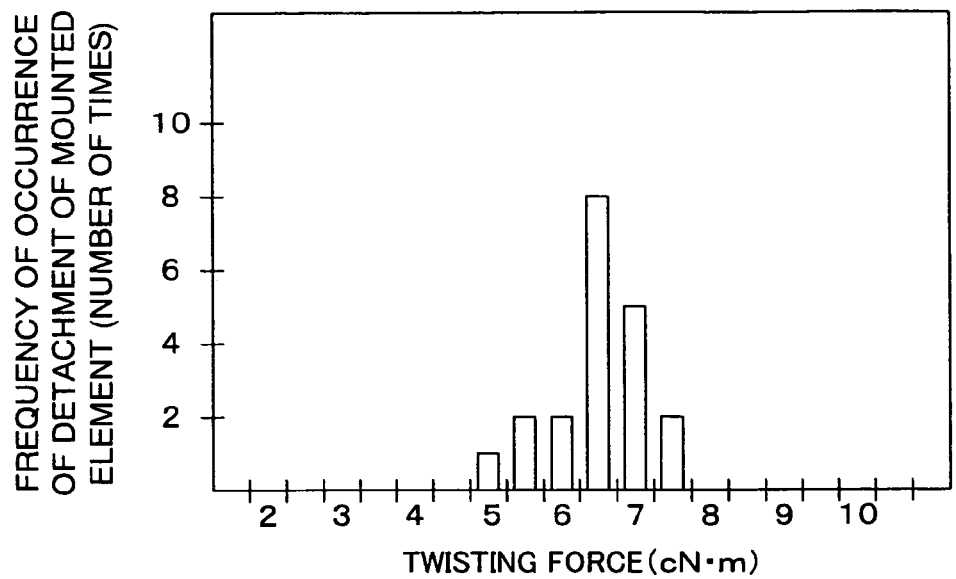
FIG. 9A and FIG. 9B are graphs showing a comparison of the frequency of occurrence of detachment of an inner mounted element (light-receiving element) when twisting force is applied to the lead frame of the semiconductor apparatus according to the embodiment of the present invention with the conventional one.
Figure 9B:
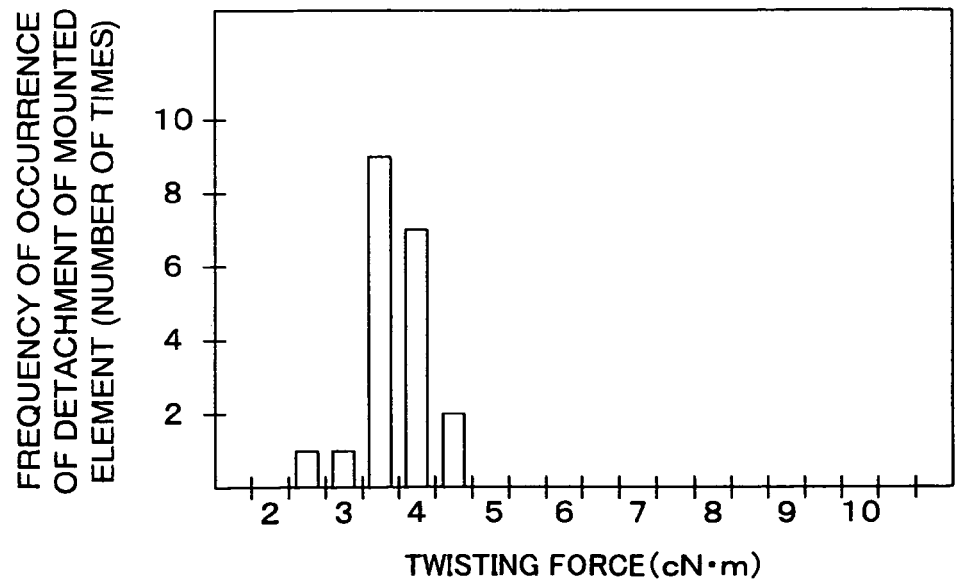

As described above, according to this embodiment, even if external force is applied to the semiconductor apparatus, occurrence of excessive stress on the surface of the lead frame 1 on which the specific element is placed can be avoided. This effect will be specifically described as data with reference to FIG. 9A and FIG. 9B. FIG. 9A and FIG. 9B are graphs showing a comparison of the frequency of occurrence of detachment of the inner mounting element (light-receiving element 5) when twisting force is applied to the lead frame 1 of the semiconductor apparatus according to the embodiment of the present invention with the conventional one. FIG. 9A shows a case of the light-receiving element 5 in FIG. 5, and FIG. 9B shows a case of the light-receiving element 5 in FIG. 6. FIG. 9A and FIG. 9B show that the difference between the above two cases is clear, which shows effectiveness of this embodiment.

Moreover, assuming that the lead frame 1 and the molded resin 2 are closely attached and bonded mechanically and that a rotation axis parallel to the lead terminal portion 1a exists, a stress case where torque in opposite directions are applied from the front side and backside of the molded resin 2 is thought about by a computer simulation. In this case, stress due to twisting occurs to the lead frame 1. When the conventional case (FIG. 6) and this embodiment (FIG. 5) are compared, the Mises equivalent stress which occurs in a portion where the remarking element is placed is 116 MPa in the conventional case (FIG. 6), and 57 MPa in this embodiment (FIG. 5), which reveals that the Mises equivalent stress is reduced to approximately half.

Incidentally, in the above description, the case of the semiconductor laser apparatus having the hollow-structured envelope (molded resins 2 and 6) is explained, but the same effect can be obtained also by an apparatus having an envelope with a structure filled with resin or the like instead of the hollow structure. Moreover, the apparatus with a structure in which a partial surface of the lead frame 1 is exposed from the envelope is explained, but the same effect can be obtained also by an apparatus with a structure in which the lead frame 1 is embedded in the envelope. Further, the element whose separation becomes a problem is not limited to the light-receiving element 5, and naturally may be the ceramic substrate 3 (ceramic substrate 3 including the laser chip 4), an IC chip, an optical element, or a light emitting element. The present invention is not limited to the semiconductor laser apparatus and applicable to a semiconductor light-emitting apparatus, a semiconductor light-receiving apparatus, an optical coupling apparatus, and so on.

It should be understood that the present invention is not limited to the specific aspects described above with illustration and all the changes which come within the range of equivalency of the following claims are therefore intended to be embraced therein.

What is claimed is:

1. A semiconductor apparatus, comprising:
   a lead frame having a plate having a plane surface;
   a first molded resin portion being attached to a part of the plate of the lead frame;

a lead terminal extending from the lead frame;
a second molded resin portion provided to face the first molded resin portion so that the first molded resin portion is positioned between the second molded resin portion and the lead frame and the part of the plate of the lead frame faces the second resin portion without interposing the first resin portion; and
one or more elements provided on the part of the plate of the lead frame and facing the second molded resin portion, the one or more elements including a semiconductor element,
wherein no part of at least one of the elements exists on a region of the plate of the lead frame in a plan view viewed from a position on a line orthogonal to the plane surface of the plate of the lead frame, the region including an aggregation of line segments and being a part of the lead frame in which the element is provided thereon, each of the line segments being formed by any two points on an outer periphery of the plate of the lead frame outside the first and second molded resin portions, and the each of the line segments being contained entirely inside the plate of the lead frame.

2. A semiconductor apparatus as set forth in claim 1, wherein the at least one of the elements includes a laser chip.

3. A semiconductor apparatus as set forth in claim 1, wherein the plate of the lead frame has a concave figure.

4. A semiconductor apparatus as set force in claim 1, wherein the at least one of the elements is apart from the second molded resin portion.

5. A semiconductor apparatus as set forth in claim 1, wherein the at least one of the elements is a light-receiving element.

6. A semiconductor apparatus as set forth in claim 1, wherein the region of the plate of the lead frame on which the at least one of the elements is provided constitutes a same plane as a region of the plate of the lead frame on which another element is provided.

7. A semiconductor apparatus as set forth in claim 1, wherein the plate of the lead frame includes two or more portions apart from each other.

8. A semiconductor apparatus as set forth in claim 1, wherein part of the lead frame is embedded in the first molded resin portion.

9. A semiconductor apparatus as set forth in claim 1, wherein the lead frame includes copper.

10. A semiconductor apparatus as set forth in claim 1, wherein the first molded resin portion is polyphtalamide.

11. A semiconductor apparatus, comprising:
a lead frame having a plate having a plane surface;
a first molded resin portion being attached to a part of the plate of the lead frame;
a lead terminal extending from the lead frame;
a second molded resin portion provided to face the first molded resin portion so that the first molded resin portion is positioned between the second molded resin portion and the lead frame and the part of the plate of the lead frame faces the second resin portion without interposing the first resin portion; and
one or more elements provided on the part of the plate of the lead frame and facing the second molded resin portion, the one or more elements including a semiconductor element,
wherein no part of at least one of the elements exists on a region of the plate of the lead frame in a plan view viewed from a position on a line orthogonal to the plane surface of the plate of the lead frame, the region including an aggregation of line segments and being a part of the lead frame in which the element is provided thereon, each of the line segments being formed by any two points on an outer periphery of the first and second molded resin portions inside the plate of the lead frame, and the each of the line segments being contained entirely inside the plate of the lead frame.

12. A semiconductor apparatus as set forth in claim 11, wherein the at least one of the elements includes a laser chip.

13. A semiconductor apparatus as set forth in claim 11, wherein the plate of the lead frame has a concave figure.

14. A semiconductor apparatus as set force in claim 11, wherein the at least one of the elements is apart from the second molded resin portion.

15. A semiconductor apparatus as set forth in claim 11, wherein the at least one of the elements is a light-receiving element.

16. A semiconductor apparatus as set forth in claim 11, wherein the region of the plate of the lead frame on which the at least one of the elements is provided constitutes a same plane as a region of the plate of the lead frame on which another element is provided.

17. A semiconductor apparatus as set forth in claim 11, wherein the plate of the lead frame includes two or more portions apart from each other.

18. A semiconductor apparatus as set forth in claim 11, wherein part of the lead frame is embedded in the first molded resin portion.

19. A semiconductor apparatus, comprising:
a lead frame having a plate having a plane surface;
a first molded resin portion being attached to a part of the plate of the lead frame;
a lead terminal extending from the lead frame;
a second molded resin portion provided to face the first molded resin portion so that the first molded resin portion is positioned between the second molded resin portion and the lead frame and the part of the plate of the lead frame faces the second resin portion without interposing the first resin portion; and
an element including a laser chip and a light-receiving element, the element and the light-receiving element being provided on the part of the plate of the lead frame and facing the second molded resin portion,
wherein no part of the light-receiving element exists on a region of the plate of the lead frame in a plan view viewed from a position on a line orthogonal to the plane surface of the plate of the lead frame, the region including an aggregation of line segments and being a part of the lead frame in which the element is provided thereon, each of the line segments being formed by any two points on an outer periphery of the plate of the lead frame outside the first and second molded resin portions, and the each of the line segments being contained entirely inside the plate of the lead frame.

20. A semiconductor apparatus as set forth in claim 1, wherein the part of the plate of the lead frame is not completely surrounded by the first molded resin portion.

* * * * *

UNITED STATES PATENT AND TRADEMARK OFFICE
CERTIFICATE OF CORRECTION

| | | |
|---|---|---|
| PATENT NO. | : 7,391,102 B2 | Page 1 of 1 |
| APPLICATION NO. | : 10/961409 | |
| DATED | : June 24, 2008 | |
| INVENTOR(S) | : Satoshi Komoto et al. | |

It is certified that error appears in the above-identified patent and that said Letters Patent is hereby corrected as shown below:

On the Title Page, Section 54 and Column 1:
    Please delete "STRENGHT" and insert --STRENGTH--

In Column 10, Claim 14, Line 16:
    Please delete "force" and insert --forth--

Signed and Sealed this

Twenty-sixth Day of May, 2009

JOHN DOLL
*Acting Director of the United States Patent and Trademark Office*